(12) United States Patent
Lee et al.

(10) Patent No.: US 11,776,866 B2
(45) Date of Patent: Oct. 3, 2023

(54) SEMICONDUCTOR MODULE HEATSPREADING LID HAVING INTEGRATED SEPARATORS FOR MULTIPLE CHIPS

(71) Applicant: SAMSUNG ELECTRONICS CO., LTD., Suwon-si (KR)

(72) Inventors: Shle-Ge Lee, Seoul (KR); Youngbae Kim, Seoul (KR); Ae-Nee Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/994,938

(22) Filed: Aug. 17, 2020

(65) Prior Publication Data
US 2021/0183724 A1 Jun. 17, 2021

(30) Foreign Application Priority Data
Dec. 12, 2019 (KR) .......................... 10-2019-0165813

(51) Int. Cl.
*H01L 21/768* (2006.01)
*H01L 23/522* (2006.01)
(Continued)

(52) U.S. Cl.
CPC .......... *H01L 23/367* (2013.01); *H01L 23/528* (2013.01); *H01L 24/14* (2013.01); *H01L 25/0655* (2013.01); *H01L 2224/73253* (2013.01)

(58) Field of Classification Search
CPC ..... H01L 23/367; H01L 23/528; H01L 24/14; H01L 25/0655; H01L 2224/73253;
(Continued)

(56) References Cited

U.S. PATENT DOCUMENTS 5,604,978 A * 2/1997 Sherif ................. H01L 25/0655
361/705
5,757,620 A * 5/1998 Edwards ............. H01L 25/0655
257/713

(Continued)

FOREIGN PATENT DOCUMENTS

| JP | 2007-194535 | 8/2007 |
| JP | 2011-035352 | 2/2011 |

*Primary Examiner* — Marcos D. Pizarro
*Assistant Examiner* — Tenley H Schofield
(74) *Attorney, Agent, or Firm* — F. CHAU & ASSOCIATES, LLC

(57) ABSTRACT

A semiconductor module includes a substrate having a central region, an outer region that surrounds the central region, and a middle region disposed between the central and the outer region, a first semiconductor package mounted on the central region of the substrate, a plurality of second semiconductor packages mounted on the middle region of the substrate, and a heat radiation structure disposed on the first semiconductor package and second semiconductor packages. The heat radiation structure includes a first part that is disposed on top surfaces of the first and second semiconductor packages, a second part that surrounds the middle region, a third part that is spaced apart from the second part and surrounds the first semiconductor package, and a fourth part that connects the second part to the third part.

16 Claims, 14 Drawing Sheets

(51) Int. Cl.
  *H01L 23/00* (2006.01)
  *H01L 23/31* (2006.01)
  *H01L 23/495* (2006.01)
  *H01L 23/528* (2006.01)
  *H01L 23/532* (2006.01)
  *H01L 23/367* (2006.01)
  *H01L 25/065* (2023.01)

(58) Field of Classification Search
  CPC .......... H01L 23/473; H01L 2924/0002; H01L 2924/00; H05K 7/20909; F28F 3/048; F28F 2215/04
  See application file for complete search history.

(56) References Cited

U.S. PATENT DOCUMENTS

| | | | |
|---|---|---|---|
| 5,787,310 A * | 7/1998 | Shimizu | G06F 13/1684 365/189.02 |
| 5,990,418 A * | 11/1999 | Bivona | H01L 23/16 174/547 |
| 6,943,436 B2 * | 9/2005 | Radu | H01L 23/552 257/691 |
| 6,979,899 B2 * | 12/2005 | Edwards | H01L 23/36 257/E23.101 |
| 7,250,676 B2 | 7/2007 | Wang | |
| 7,254,032 B1 | 8/2007 | Xue et al. | |
| 7,875,971 B2 * | 1/2011 | Sato | H01L 23/3675 257/730 |
| 7,944,046 B2 * | 5/2011 | Chao | H01L 25/0655 257/713 |
| 8,602,971 B2 | 12/2013 | Farr | |
| 9,041,192 B2 | 5/2015 | Saeidi et al. | |
| 9,355,997 B2 | 5/2016 | Katkar et al. | |
| 10,700,046 B2 * | 6/2020 | Rickard | H01L 23/49822 |
| 2002/0041018 A1 * | 4/2002 | Ro | H01L 23/4006 438/106 |
| 2002/0167080 A1 * | 11/2002 | Barber | H01L 25/16 257/691 |
| 2005/0072972 A1 * | 4/2005 | Tashiro | H01L 21/67333 257/E23.179 |
| 2007/0069366 A1 * | 3/2007 | Chang | H01L 23/16 257/700 |
| 2009/0057884 A1 * | 3/2009 | Too | H01L 23/04 257/723 |
| 2010/0230797 A1 * | 9/2010 | Honda | H01L 23/10 257/687 |
| 2011/0240361 A1 * | 10/2011 | Bardia | H05K 5/0026 174/66 |
| 2012/0250260 A1 * | 10/2012 | Burton | G06F 1/181 361/720 |
| 2013/0119529 A1 * | 5/2013 | Lin | H01L 23/3675 438/118 |
| 2014/0077352 A1 * | 3/2014 | Leal | H01L 23/49838 257/E23.08 |
| 2017/0287799 A1 * | 10/2017 | Klein | H01L 23/16 |
| 2020/0176431 A1 * | 6/2020 | Zhong | H01L 25/18 |
| 2020/0395269 A1 * | 12/2020 | Dubey | H01L 25/065 |
| 2021/0057354 A1 * | 2/2021 | Eid | B33Y 80/00 |
| 2021/0143104 A1 * | 5/2021 | Hu | H01L 23/18 |

* cited by examiner

SEMICONDUCTOR MODULE HEATSPREADING LID HAVING INTEGRATED SEPARATORS FOR MULTIPLE CHIPS

CROSS-REFERENCE TO RELATED APPLICATION

This patent application claims priority under 35 U.S.C. § 119 to Korean Patent Application No. 10-2019-0165813, filed on Dec. 12, 2019 in the Korean Intellectual Property Office (KIPO), the disclosure of which is herein incorporated by reference in its entirety.

TECHNICAL FIELD

The present disclosure relates to a semiconductor module, and more particularly, to a semiconductor module with a heat radiation structure.

DISCUSSION OF THE RELATED ART

Semiconductor packages are provided to implement an integrated circuit (IC) chip on each package to qualify for use in various electronic products. A conventional semiconductor package may be configured such that a semiconductor chip is mounted on a printed circuit board (PCB) and bonding wires or bumps are used to electrically connect the semiconductor chip to the printed circuit board. The higher speed and capacity the semiconductor package has, the more power the semiconductor package may consume. Thermal characteristics may be regarded as an important factor when designing or manufacturing semiconductor packages.

SUMMARY

Some exemplary embodiments of the present inventive concept provide a semiconductor module whose durability is increased.

According to some exemplary embodiments of the inventive concept, a semiconductor module may comprise: a substrate having a central region and an edge region that surrounds the central region, the edge region including a first edge section that includes a corner zone of the substrate, and a second edge section disposed between the central region of the substrate and a lateral surface of the substrate; a plurality of semiconductor packages mounted on the substrate; and a heat radiation structure on the semiconductor packages. The heat radiation structure may include: a first part on top surfaces of the semiconductor packages; and a second part that surrounds the semiconductor packages. The second part and the first part may be connected to each other on the edge region of the substrate. A width in a first direction of the second part on the first edge section may be different from a width in the first direction of the second part on the second edge section.

According to some exemplary embodiments of the inventive concept, a semiconductor module may comprise: a substrate having a central region, an outer region that surrounds the central region, and a middle region disposed between the central region and the outer region; a first semiconductor package mounted on the central region of the substrate; a plurality of second semiconductor packages mounted on the middle region of the substrate; and a heat radiation structure disposed on the first semiconductor package and the second semiconductor packages. The heat radiation structure may include: a first part that is disposed on top surfaces of the first and second semiconductor packages; a second part that surrounds the middle region, the second part and the first part being connected to each other on the outer region of the substrate; a third part that is spaced apart from the second part and surrounds the first semiconductor package, the third part and the first part being connected to each other on the central region of the substrate; and a fourth part that connects the second part to the third part.

According to some exemplary embodiments of the inventive concept, a semiconductor module may comprise: a substrate having a central region and an edge region that surrounds the central region, in a plan view, the edge region including a first edge section that includes a corner zone of the substrate, and a second edge section disposed between the central region of the substrate and a lateral surface of the substrate; a plurality of semiconductor packages mounted on the substrate; a plurality of connection terminals disposed between the substrate and the semiconductor packages; a plurality of external terminals disposed on a bottom surface of the substrate and coupled to the connection terminals; a heat radiation structure disposed on the semiconductor packages; and a thermal conductive layer disposed between the heat radiation structure and the semiconductor packages. The semiconductor packages may include: a first semiconductor package; and a plurality of second semiconductor packages different from the first semiconductor package. The heat radiation structure may include: a first part on top surfaces of the first and second semiconductor packages; and a second part that surrounds the first and second semiconductor packages, in a plan view. The second part and the first part may be connected to each other on the edge region of the substrate. A width in a first direction of the second part on the first edge section may be different from a width in the first direction of the second part on the second edge section.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
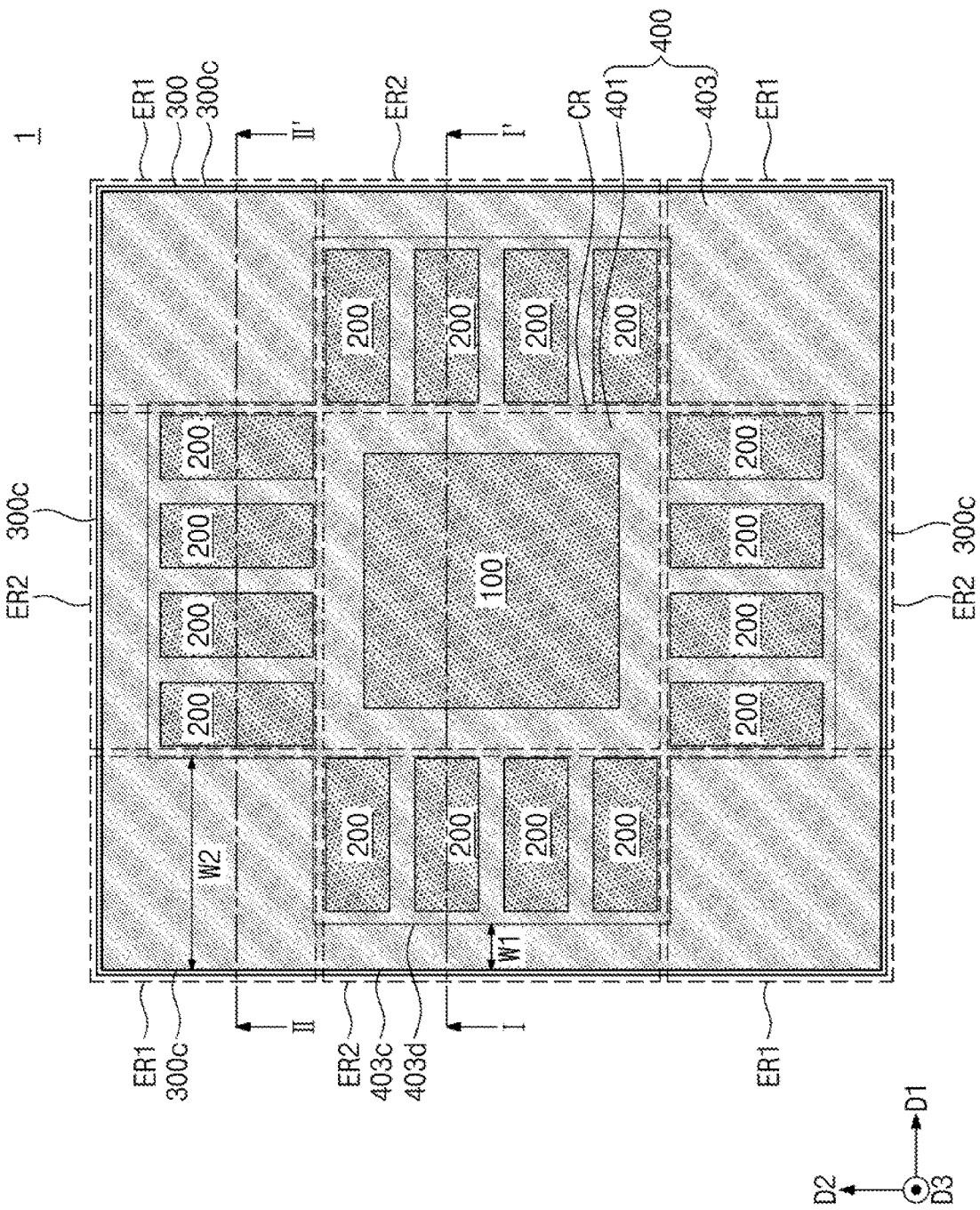
FIG. 1 illustrates a plan view showing a semiconductor module according to an exemplary embodiment of the inventive concept.

Herein, it will be understood that when an element or layer is referred to as being "on", "connected to" or "coupled to" another element or layer, it can be directly on, connected or coupled to the other element or layer, or intervening elements or layers may be present.

Like reference numerals may refer to like elements throughout this specification. In the figures, the thicknesses of layers, films or regions may be exaggerated for clarity.

As used herein, the singular forms, "a", "an" and "the" are intended to include the plural forms as well, unless the context clearly indicates otherwise.

Hereinafter, exemplary embodiments of the present inventive concept will be explained in detail with reference to the accompanying drawings.

Figure 2:
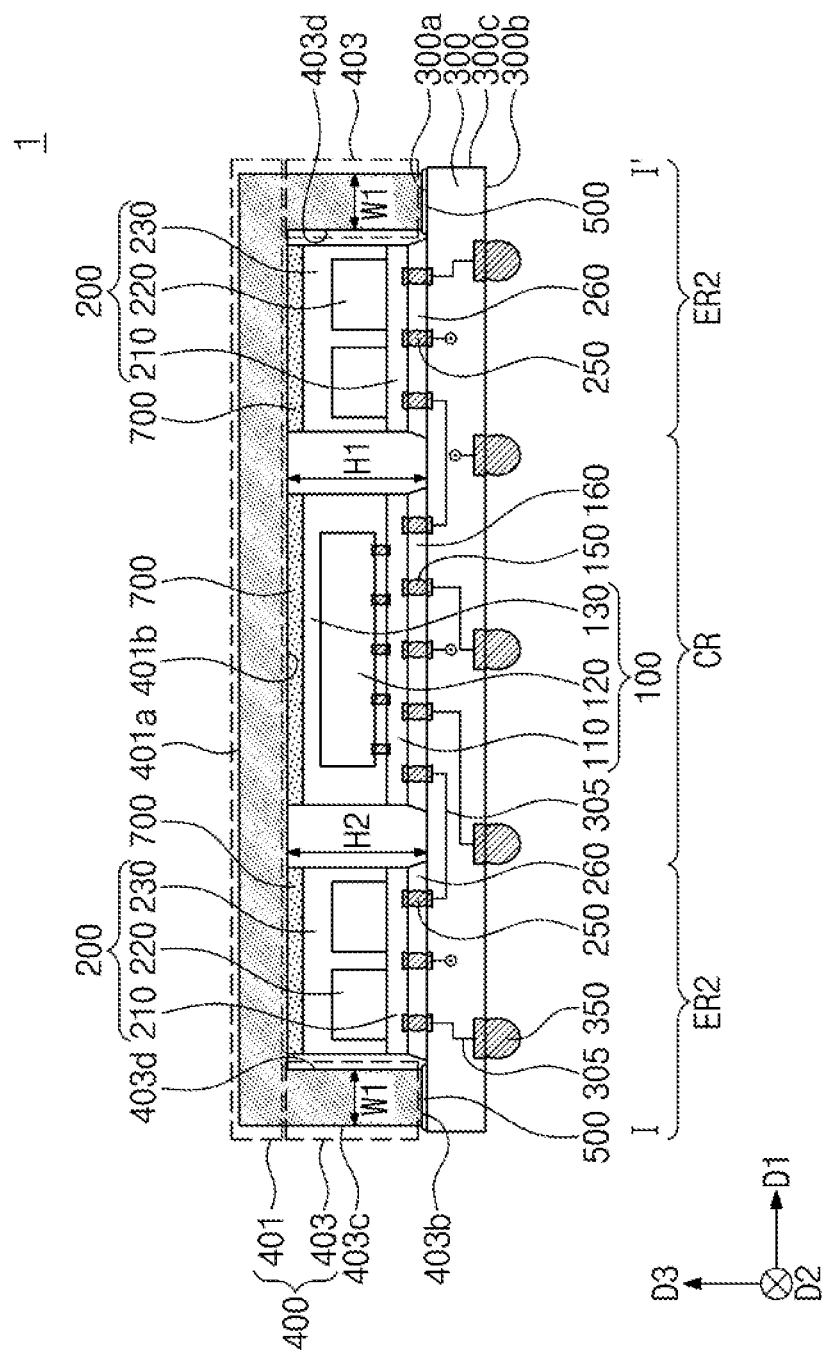
FIG. 2 illustrates a cross-sectional view taken along line I-I' of FIG. 1 according to an exemplary embodiment of the inventive concept.
Figure 3:
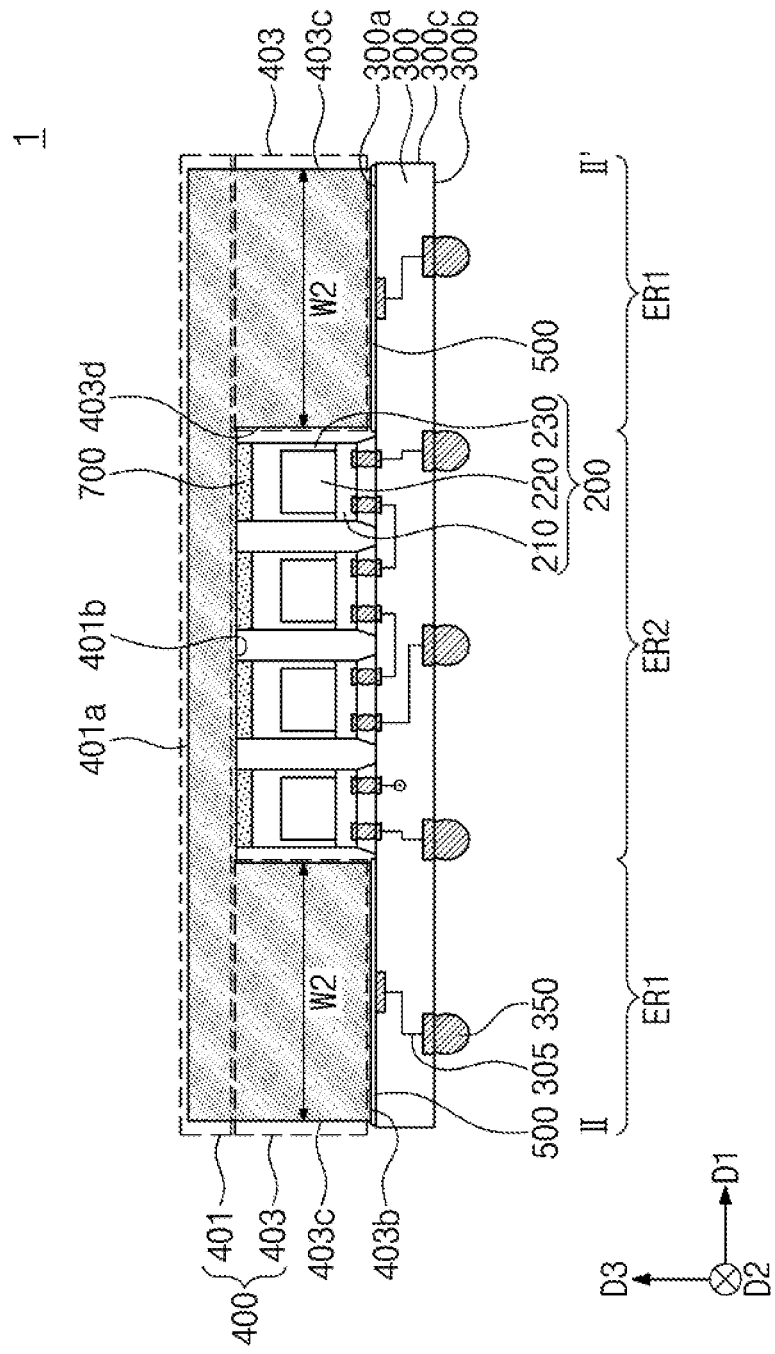
FIG. 3 illustrates a cross-sectional view taken along line II-II' of FIG. 1 according to an exemplary embodiment of the inventive concept.
Figure 4:
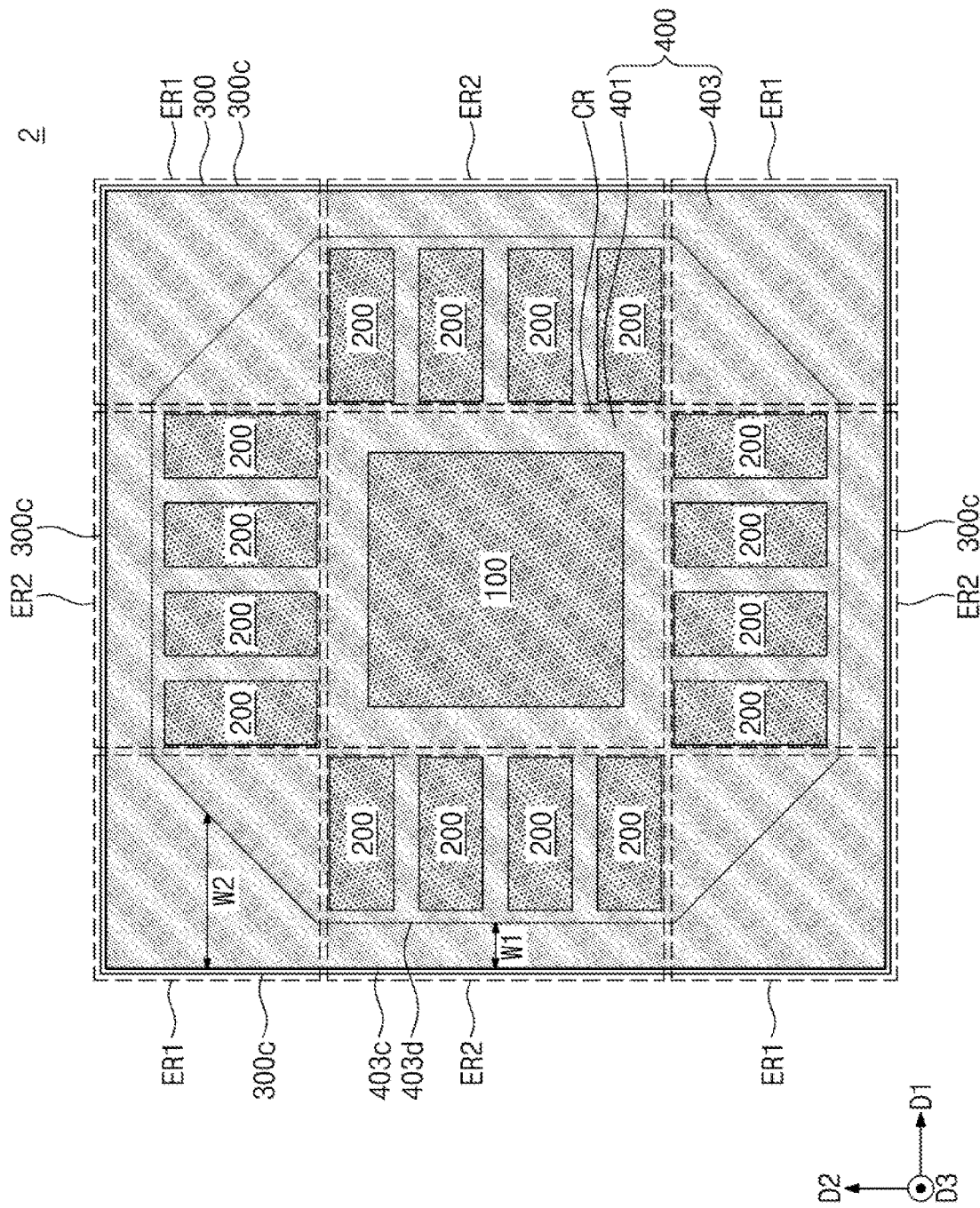
FIG. 4 illustrates a plan view showing a semiconductor module according to an exemplary embodiment of the inventive concept.
Figure 5:
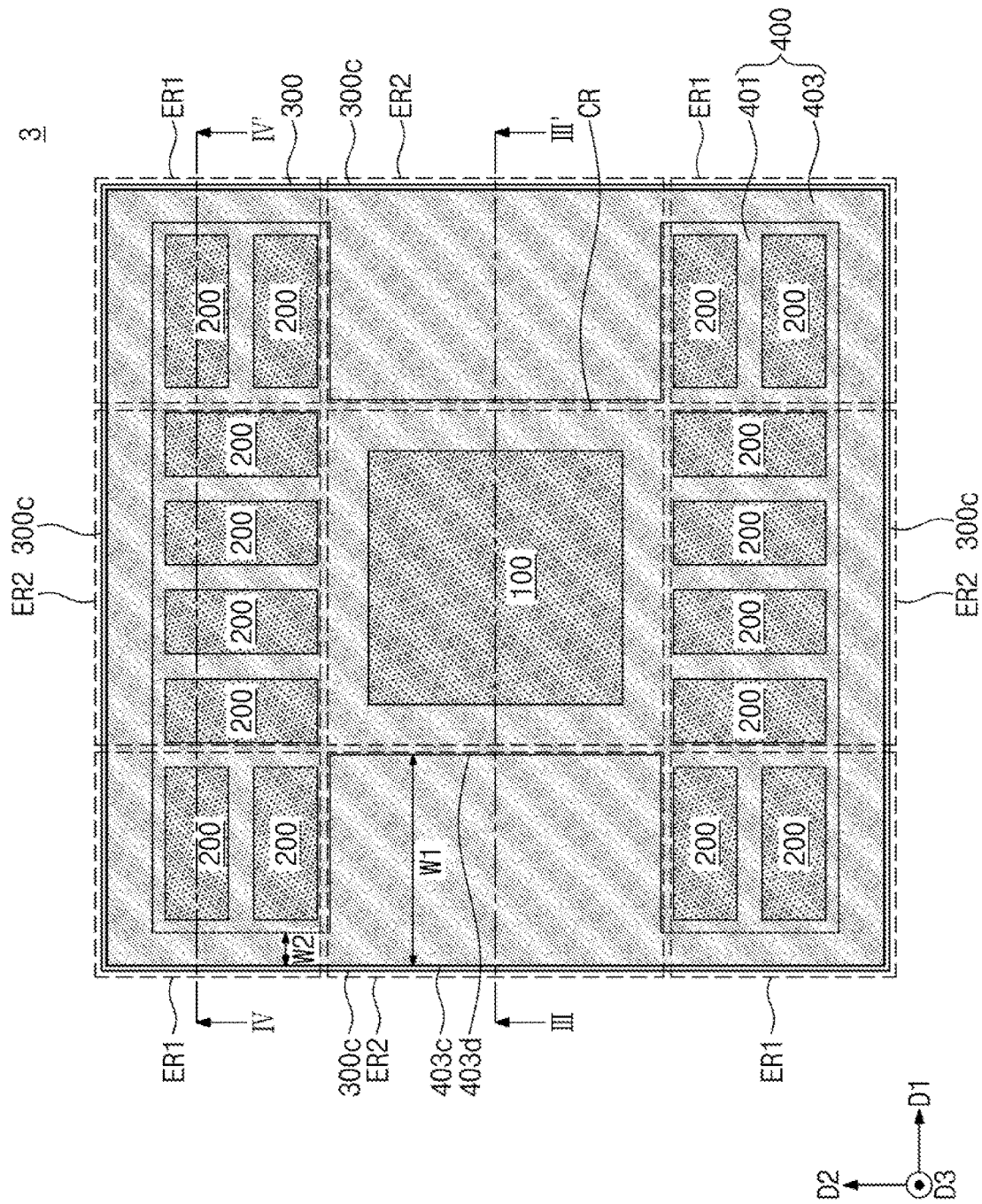
FIG. 5 illustrates a plan view showing a semiconductor module according to an exemplary embodiment of the inventive concept.
Figure 6:
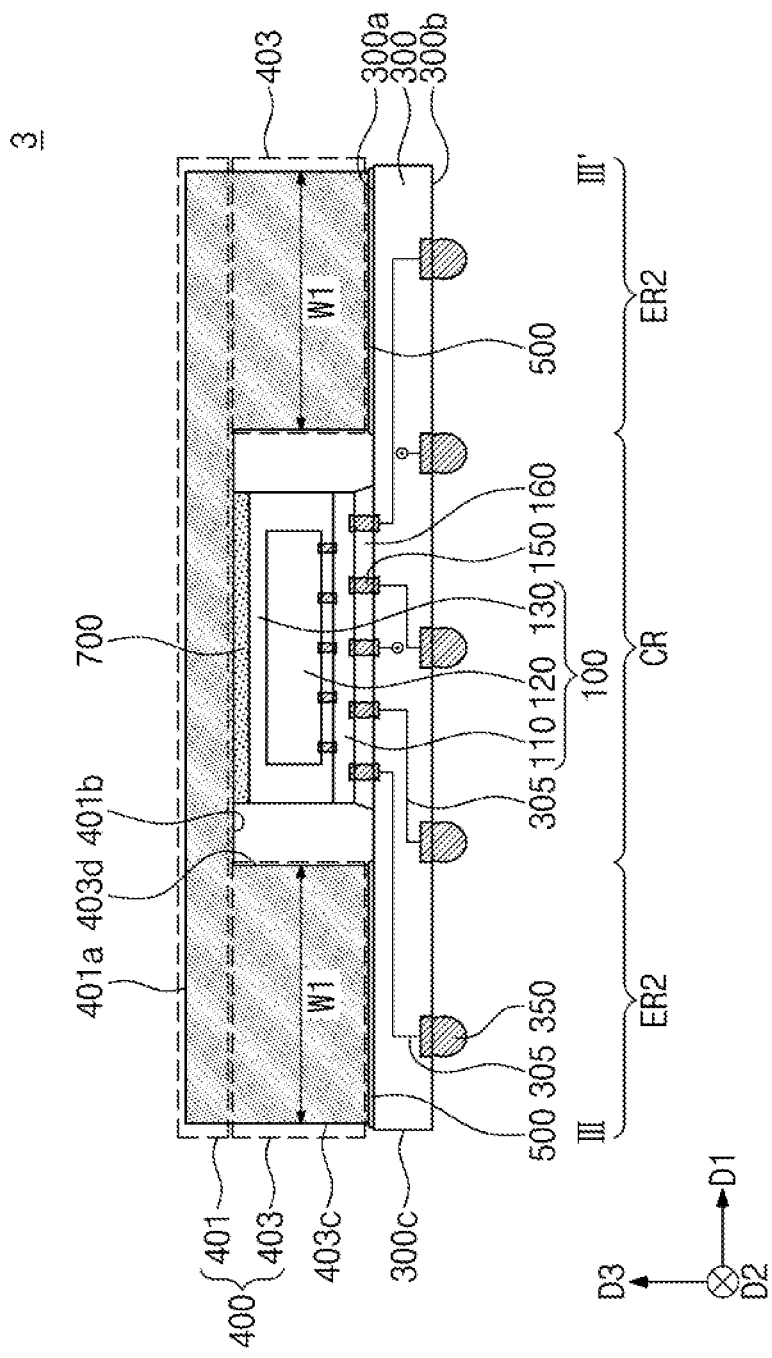
FIG. 6 illustrates a cross-sectional view taken along line of FIG. 5 according to an exemplary embodiment of the inventive concept.
Figure 7:
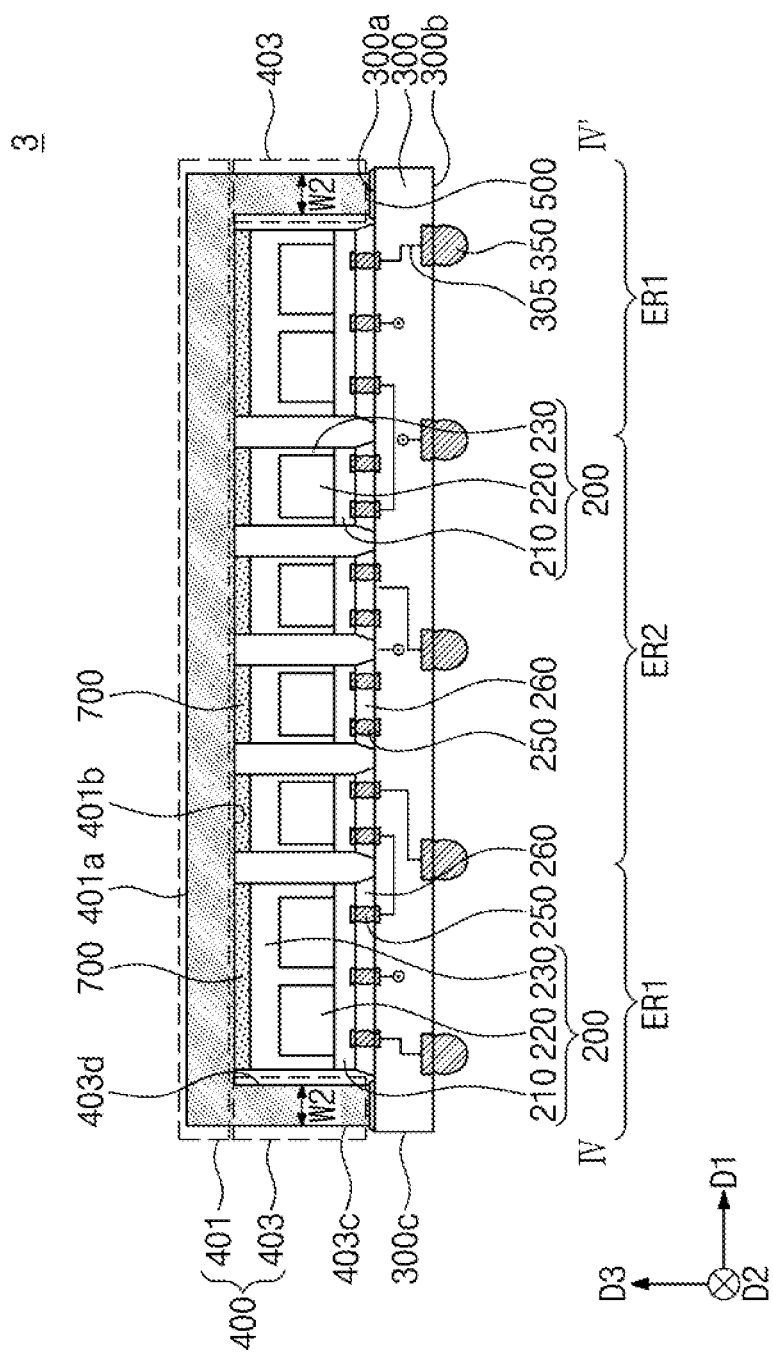
FIG. 7 illustrates a cross-sectional view taken along line IV-IV' of FIG. 5 according to an exemplary embodiment of the inventive concept.

FIG. 1 illustrates a plan view showing a semiconductor module according to an exemplary embodiment of the inventive concept. FIG. 2 illustrates a cross-sectional view taken along line I-I' of FIG. 1. FIG. 3 illustrates a cross-sectional view taken along line II-IF of FIG. 1. FIG. 4 illustrates a plan view showing a semiconductor module according to an exemplary embodiment of the inventive concept. FIG. 5 illustrates a plan view showing a semiconductor module according to an exemplary embodiment of the inventive concept. FIG. 6 illustrates a cross-sectional view taken along line of FIG. 5. FIG. 7 illustrates a cross-sectional view taken along line IV-IV' of FIG. 5.

Referring to FIGS. 1 to 3, a semiconductor module 1 may include a substrate 300, a first semiconductor package 100, a second semiconductor package 200, a heat radiation structure 400, an adhesive layer 500, and a thermal conductive layer 700. Unless otherwise stated, a description with reference to FIGS. 1 to 3 may also be identically or similarly applicable to a semiconductor module 2 depicted in FIG. 4 or a semiconductor module 3 depicted in FIGS. 5 to 7, and a repetitive description of substantially same components or parts will be omitted for brevity.

In a plan view, the substrate 300 may have a central region CR and edge region ER1 and ER2. The edge region ER1 and ER2 of the substrate 300 may include first edge sections ER1 and second edge sections ER2. The first edge sections ER1 and the second edge sections ER2 may surround the central region CR of the substrate 300. The first and second edge sections ER1 and ER2 may be closer than the central region CR to lateral surfaces 300c of the substrate 300. The first edge sections ER1 may correspond to corner zones of the substrate 300. For example, each of the first edge sections ER1 may be adjacent to a corner, or an intersection between two adjacent lateral surfaces 300c of the substrate 300. The second edge section ER2 may be provided between the first edge sections ER1 and adjacent to one of the lateral surfaces 300c of the substrate 300. For example, a printed circuit board (PCB) having a circuit pattern may be used as the substrate 300. The substrate 300 may have a top surface 300a and a bottom surface 300b opposite to the top surface 300a. External terminals 350 may be provided on the bottom surface 300b of the substrate 300. The external terminals 350 may include one or more of solder balls, bumps, and pillars. The external terminals 350 may include, for example, a metal.

The first semiconductor package 100 may be mounted on the top surface 300a of the substrate 300. In a plan view, the first semiconductor package 100 may be disposed on the central region CR of the substrate 300. The first semiconductor package 100 may include a first substrate 110, a first semiconductor chip 120, and a first molding layer 130. A printed circuit board or a redistribution layer may be used as the first substrate 110. The first semiconductor chip 120 may be flip-chip mounted on the first substrate 110. Connection members may be provided between the first semiconductor chip 120 and the first substrate 110. The connection members may include solder balls, pillars, bumps, or a ball grid array. The first semiconductor chip 120 may be a system-on-chip (SOC), a logic chip, or an application processor (AP). The first semiconductor chip 120 may include circuits having different functions. The first semiconductor chip 120 may include two or more of a logic circuit, a memory circuit, a digital integrated circuit (IC), a wireless radio-frequency integrated circuit (RFIC), and an input/output circuit. Heat generated from the first semiconductor chip 120 is the heat present at the first semiconductor package 100.

The first substrate 110 may be provided thereon with the first molding layer 130 that covers the first semiconductor chip 120. The first molding layer 130 may cover lateral and top surfaces of the first semiconductor chip 120, thereby encapsulating the first semiconductor chip 120. In some cases, the first molding layer 130 may expose the top surface of the first semiconductor chip 120. The first molding layer 130 may include a dielectric polymer, such as an epoxy-based molding compound.

First connection terminals 150 may be interposed between the substrate 300 and the first substrate 110. The first semiconductor package 100 may be electrically connected through the first connection terminals 150 to the substrate 300, as well as connected to various wiring lines 305 within the substrate 300. The first connection terminals 150 may include solder balls, pillars, bumps, or a ball grid array. A pitch of the first connection terminals 150 may be less than a pitch of the external terminals 350. For example, the pitch between two adjacent connection terminals 150 may be less than the pitch between two adjacent external terminals 350. The mounted first semiconductor package 100 may have a height (see H1 of FIG. 2) that includes a height of the first connection terminal 150. In this description, a height of any component may indicate a maximum distance of the component measured in a direction perpendicular to the top surface 300a of the substrate 300.

A first underfill layer 160 may be provided on the top surface 300a of the substrate 300. The first underfill layer 160 may fill the gap area between the first semiconductor package 100 and the top surface 300a of the substrate 300. The first underfill layer 160 may surround the first connection terminals 150.

The second semiconductor package 200 may be mounted on the top surface 300a of the substrate 300. In a plan view, the second semiconductor package 200 may be disposed on the edge region ER1 and ER2 of the substrate 300. For example, the second semiconductor package 200 may be disposed on the first edge section ER1 and/or the second edge section ER2 of the substrate 300. When viewed in plan, the second semiconductor package 200 may be disposed spaced apart from the first semiconductor package 100. The second semiconductor package 200 may include a second substrate 210, a second semiconductor chip 220, and a second molding layer 230. A printed circuit board or a redistribution layer may be used as the second substrate 210. The second semiconductor chip 220 may be disposed on the second substrate 210. The second semiconductor chip 220 may be of a different type from the first semiconductor chip 120. For example, the second semiconductor package 200 may be of a different type from the first semiconductor package 100. The second semiconductor chip 220 may serve as a memory chip. The memory chip may include a dynamic random access memory (DRAM) chip. Alternatively, the memory chip may include a static random access memory (SRAM), a magnetic random access memory (MRAM), and/or a NAND Flash memory. Heat generated from the second semiconductor chip 220 is the heat present at the second semiconductor package 200. The second semiconductor chip 220 may be electrically connected through bonding wires to the second substrate 210. In another example, the second semiconductor chip 220 may be flip-chip mounted on the second substrate 210. The second semiconductor package 200 may include a plurality of second semiconductor chips 220. Alternatively, the second semiconductor package 200 may include a single second semiconductor chip 220. The second molding layer 230 may cover lateral and top surfaces of the second semiconductor chip 220, thereby encapsulating the second semiconductor chip 220. In some cases, the second molding layer 230 may cover the lateral surface of the second semiconductor chip 220, but may expose the top surface of the second semiconductor chip 220. The second molding layer 230 may include a dielectric polymer, such as an epoxy-based molding compound.

Second connection terminals 250 may be interposed between the substrate 300 and the second substrate 210. The second semiconductor package 200 may be electrically connected through the second connection terminals 250 to the substrate 300. The second connection terminals 250 may include solder balls, pillars, bumps, or a ball grid array. A pitch of the second connection terminals 250 may be less than the pitch of the external terminals 350. For example, the pitch between two adjacent second connection terminals 250 may be less than the pitch between two adjacent external terminals 350. The mounted second semiconductor package 200 may have a height (see H2 of FIG. 2) that includes a height of the second connection terminal 250. For example, the height H2 of the mounted second semiconductor package 200 may be the same as a sum of heights of the second connection terminal 250, the second substrate 210, and the second molding layer 230. The height H1 of the mounted first semiconductor package 100 may be the same as the height H2 of the mounted second semiconductor package 200.

A second underfill layer 260 may be provided on the top surface 300a of the substrate 300. The second underfill layer 260 may fill the gap area between the second semiconductor package 200 and the top surface 300a of the substrate 300. The second underfill layer 260 may surround the second connection terminals 250.

A plurality of the second semiconductor packages 200 may be provided in the semiconductor module 1. As shown in FIG. 1, the substrate 300 may have two pairs of lateral surfaces 300c opposite to each other. The second semiconductor packages 200 may be disposed spaced apart from each other. The second semiconductor packages 200 may be disposed on the edge region ER1 and ER2. The second semiconductor packages 200 may be disposed on one or more of the first and second edge sections ER1 and ER2. In a plan view, one or more of the second semiconductor packages 200 may be disposed between the first semiconductor package 100 and the lateral surfaces 300c of the substrate 300. For example, as shown in FIG. 1 or 4, the second semiconductor packages 200 may surround the first semiconductor package 100 in a plan view. In another example, as shown in FIG. 5, the second semiconductor packages 200 may be disposed adjacent to a pair of lateral surfaces 300c opposite to each other across the first semiconductor package 100. The second semiconductor packages 200 may be disposed symmetrically to each other about the first semiconductor package 100. The first semiconductor package 100 may be disposed between the second semiconductor packages 200, and thus reduced signal paths may be provided between the first semiconductor package 100 and the second semiconductor packages 200. In addition, semiconductor packages may improve in electrical characteristics such as signal integrity. However, the number and planar arrangement of the second semiconductor packages 200 may be variously changed without being limited to that shown in FIG. 1.

As shown in FIG. 2, the first semiconductor package 100 may be electrically connected through the wiring lines 305 of the substrate 300 to the second semiconductor package 200 and the external terminals 350. The second semiconductor package 200 may be electrically connected through the wiring lines 305 of the substrate 300 to the first semiconductor package 100 and the external terminals 350.

The heat radiation structure 400 may be provided on the first semiconductor package 100 and the second semiconductor packages 200. The heat radiation structure 400 may include a first part 401 and a second part 403.

The first part 401 of the heat radiation structure 400 may be provided on a top surface of the first semiconductor package 100 and top surfaces of the second semiconductor packages 200. In a plan view, the first part 401 of the heat radiation structure 400 may overlap the central region CR and the edge region ER1 and ER2 of the substrate 300. The first part 401 of the heat radiation structure 400 may have a first top surface 401a and a first bottom surface 401b that are opposite to each other. The first top surface 401a of the heat radiation structure 400 may essentially be flat. The first bottom surface 401b of the heat radiation structure 400 may be provided at the same level as that of the top surface of the first semiconductor package 100 and that of the top surfaces of the second semiconductor packages 200. For example, the first bottom surface 401b of the heat radiation structure 400 on the first semiconductor package 100 may be located at substantially the same level as that of the first bottom surface 401b of the heat radiation structure 400 on the second semiconductor packages 200.

The first part 401 of the heat radiation structure 400 may provide thermal conduction and heat dissipation of the semiconductor module 1. For example, when the semiconductor module 1 operates, the first part 401 of the heat radiation structure 400 may receive heat generated from the first and second semiconductor packages 100 and 200. The heat radiation structure 400 may include a thermally conductive material. The thermally conductive material may include a metallic material (e.g., copper and/or aluminum) or a carbon-containing material (e.g., graphene, graphite, and/or carbon nano-tube). The heat radiation structure 400 may have relatively high thermal conductivity. Therefore, the first part 401 of the heat radiation structure 400 may immediately dissipate heat transmitted from the first and second semiconductor packages 100 and 200.

The thermal conductive layer 700 may be interposed between the first semiconductor package 100 and the first part 401 of the heat radiation structure 400 and between the second semiconductor packages 200 and the first part 401 of the heat radiation structure 400. The thermal conductive layer 700 may be in physical contact with the top surface of the first semiconductor package 100 and with the first bottom surface 401b of the heat radiation structure 400. The thermal conductive layer 700 may be in physical contact with the top surfaces of the second semiconductor packages 200 and with the first bottom surface 401b of the heat radiation structure 400. The thermal conductive layer 700 may have thermal conductivity greater than that of air. The thermal conductive layer 700 may fill gaps between the first semiconductor package 100 and the heat radiation structure 400 and between the second semiconductor packages 200 and the heat radiation structure 400, and thus the heat radiation structure 400 may promptly receive heat generated from the first and second semiconductor packages 100 and 200. The thermal conductive layer 700 may include a thermal interface material (TIM). The thermal interface material may include, for example, a polymer and thermal conductive particles. The thermal conductive particles may be distributed in the polymer.

In a plan view, the second part 403 of the heat radiation structure 400 may be spaced apart from the first semiconductor package 100 and the second semiconductor packages 200, and may overlap the edge region ER1 and ER2 of the substrate 300. For example, the second part 403 of the heat radiation structure 400 may surround the first semiconductor package 100 and the second semiconductor packages 200. The first and second parts 401 and 403 of the heat radiation structure 400 may be formed into a single unitary body. For example, the second part 403 of the heat radiation structure 400 may include the same material as that of the first part 401 of the heat radiation structure 400, and the first and second parts 401 and 403 of the heat radiation structure 400 may be connected to each other without a boundary therebetween. The first and second parts 401 and 403 of the heat radiation structure 400 may be connected to each other on the edge region ER1 and ER2 of the substrate 300.

As shown in FIGS. 1 to 7, the second part 403 of the heat radiation structure 400 may have an outer surface 403c and an inner surface 403d that are opposite to each other. The outer surface 403c may be externally exposed, and the inner surface 403d may be adjacent to the second semiconductor packages 200. The outer surface 403c may be connected to the first top surface 401a, and the inner surface 403d may be connected to the first bottom surface 401b.

In a plan view, the outer surface 403c may extend along the lateral surfaces 300c of the substrate 300. For example, as shown in FIG. 1, 4, or 5, the outer surface 403c of the second part 403 may have a tetragonal ring shape when viewed in plan. The inner surface 403d may surround the first and second semiconductor packages 100 and 200 mounted on the substrate 300. The inner surface 403d may be crooked along lateral surfaces of the first and second semiconductor packages 100 and 200. Referring to FIG. 1 or 5, the crooked shape of the inner surface 403d may be changed depending on the arrangement of the first and second semiconductor packages 100 and 200. For example, the inner surface 403d may surround the first and second semiconductor packages 100 and 200, while being adjacent to and spaced apart at a certain distance from the lateral surfaces of the first and second semiconductor packages 100 and 200. Therefore, the inner surface 403d may have a planar shape that is changeable based on the arrangement of the mounted first and second semiconductor packages 100 and 200. In some exemplary embodiments of the inventive concept, because the inner surface 403d of the second part 403 of the heat radiation structure 400 is adjacent to the lateral surfaces of the first and second semiconductor packages 100 and 200, the second part 403 of the heat radiation structure 400 may have an increased planar area at a bottom surface 403b of the second part 403. Because the heat radiation structure 400 and the substrate 300 are attached to each other by way of contact between the bottom surface 403b of the second part 403 and the adhesive layer 500 which will be discussed below, an increase in planar area at the bottom surface 403b of the heat radiation structure 400 may force the second part 403 to securely fix the heat radiation structure 400 on the substrate 300.

Referring to FIG. 1, 4, or 5, the second part 403 may have a width W2 in a first direction D1 on the first edge section ER1 and also have a width W1 in the first direction D1 on the second edge section ER2. The width W1 may be different from the width W2. The width W2 in the first direction D1 of the second part 403 may be a distance in the first direction D1 between the outer and inner surfaces 403c and the 403d of the second part 403 on the first edge section ER1. The width W1 in the first direction D1 of the second part 403 may be a distance in the first direction D1 between the outer and inner surfaces 403c and 403d of the second part 403 on the second edge section ER2. As such, the inner surface 403d on the first edge section ER1 may not be aligned with the inner surface 403d on the second edge section ER2. The first direction D1 may be parallel to the top surface 300a of the substrate 300. The second direction D2 may be parallel to the top surface 300a of the substrate 300 and perpendicular to the first direction D1. A third direction D3 may be perpendicular to each of the first and second directions D1 and D2.

The first and second semiconductor packages 100 and 200 may be mounted on the central region CR of the substrate 300 and on portions of the edge region ER1 and ER2 of the substrate 300. For example, the first semiconductor package 100 may be mounted on the central region CR, and a plurality of second semiconductor packages 200 may be mounted on portions of the edge region ER1 and ER2. Therefore, neither the first semiconductor package 100 nor the second semiconductor packages 200 may be mounted on other portions of the edge region ER1 and ER2. In a plan view, the other portions of the edge region ER1 and ER2 may be spaced apart from the first semiconductor package 100 and the second semiconductor packages 200. The other portions of the edge region ER1 and ER2 may be covered with the second part 403 of the heat radiation structure 400. For example, as shown in FIG. 1, the second semiconductor packages 200 may not be mounted on the first edge sections ER1, but may be mounted on the second edge sections ER2. The second part 403 may cover the first edge sections ER1 completely (see FIG. 1) or partially (see FIG. 4). In another example, as shown in FIG. 5, when the second semiconductor packages 200 are mounted on the first edge sections ER1 and portions of the second edge sections ER2, and when the second semiconductor packages 200 are not mounted on other portions of the second edge sections ER2, the second part 403 may cover the other portions of the second edge sections ER2. For example, the edge region ER1 and ER2 may have non-mounting portions on which the second semiconductor packages 200 are not mounted, and the second part 403 of the heat radiation structure 400 may overlap the non-mounting portions of the edge region ER1 and ER2. A value of about 0.78 to about 2 may be given as a ratio of the planar area of the bottom surface 403b of the second part 403 to that on which the first and second semiconductor packages 100 and 200 are mounted.

The adhesive layer 500 may be interposed between the substrate 300 and the second part 403 of the heat radiation structure 400. The adhesive layer 500 may be in physical contact with the top surface 300a of the substrate 300 and with the bottom surface 403b of the second part 403 of the heat radiation structure 400. The second part 403 of the heat radiation structure 400 may be attached through the adhesive layer 500 to the substrate 300. In a plan view, the adhesive layer 500 may overlap the second part 403 of the heat radiation structure 400. In some exemplary embodiments of the inventive concept, because the inner surface 403d of the second part 403 of the heat radiation structure 400 is disposed adjacent to the lateral surfaces of the first and second semiconductor packages 100 and 200, the bottom surface 403b of the second part 403 may increase in planar area. Therefore, it may be possible to increase an area for the adhesive layer 500 and thus to more rigidly attach the heat radiation structure 400 to the substrate 300. When the heat radiation structure 400 is tightly fixed on the substrate 300, the semiconductor module 1 may not be easily deformed due to external stress. As a result, the semiconductor module 1 may increase in durability.

Figure 8:
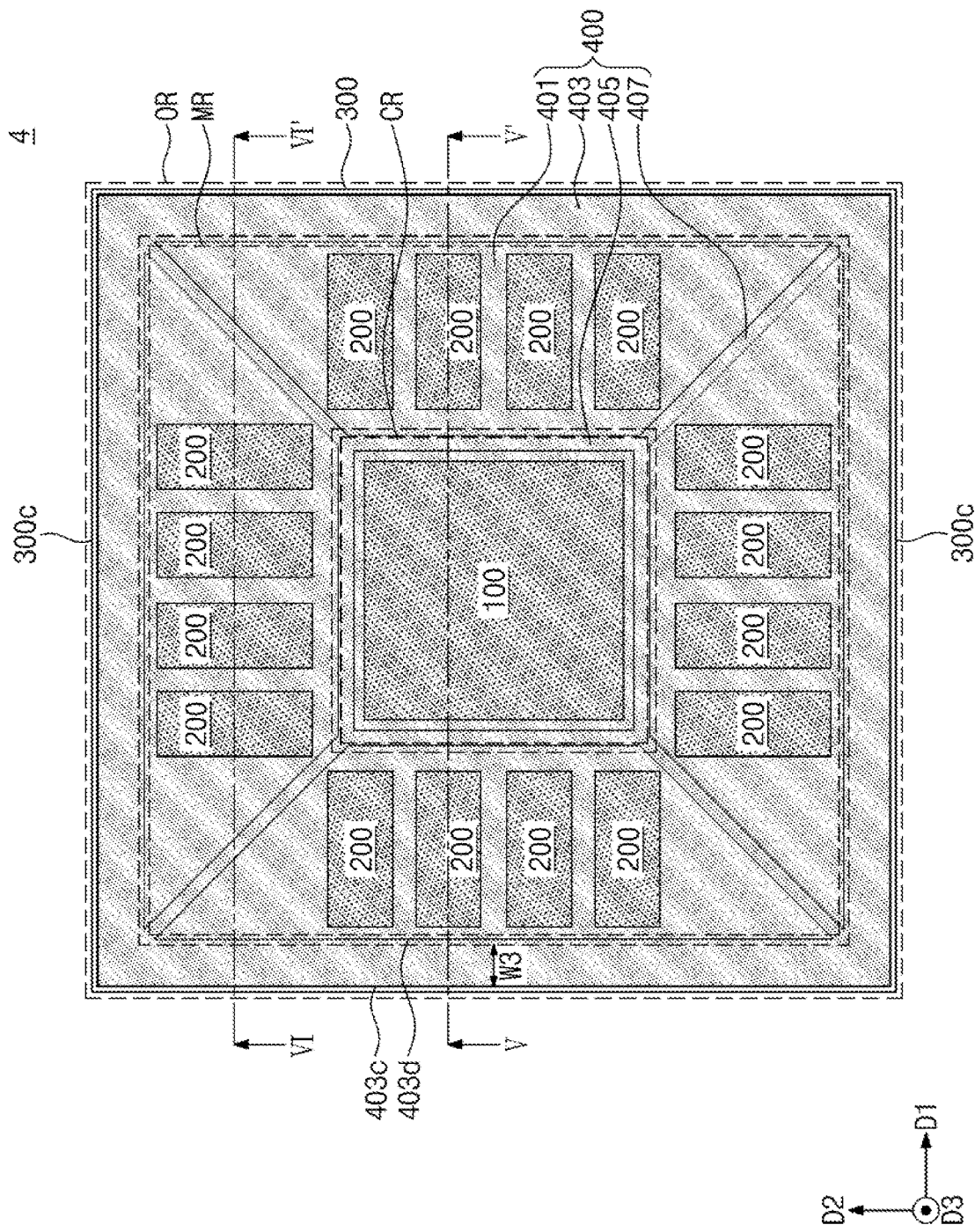
FIG. 8 illustrates a plan view showing a semiconductor module according to an exemplary embodiment of the inventive concept.
Figure 9:
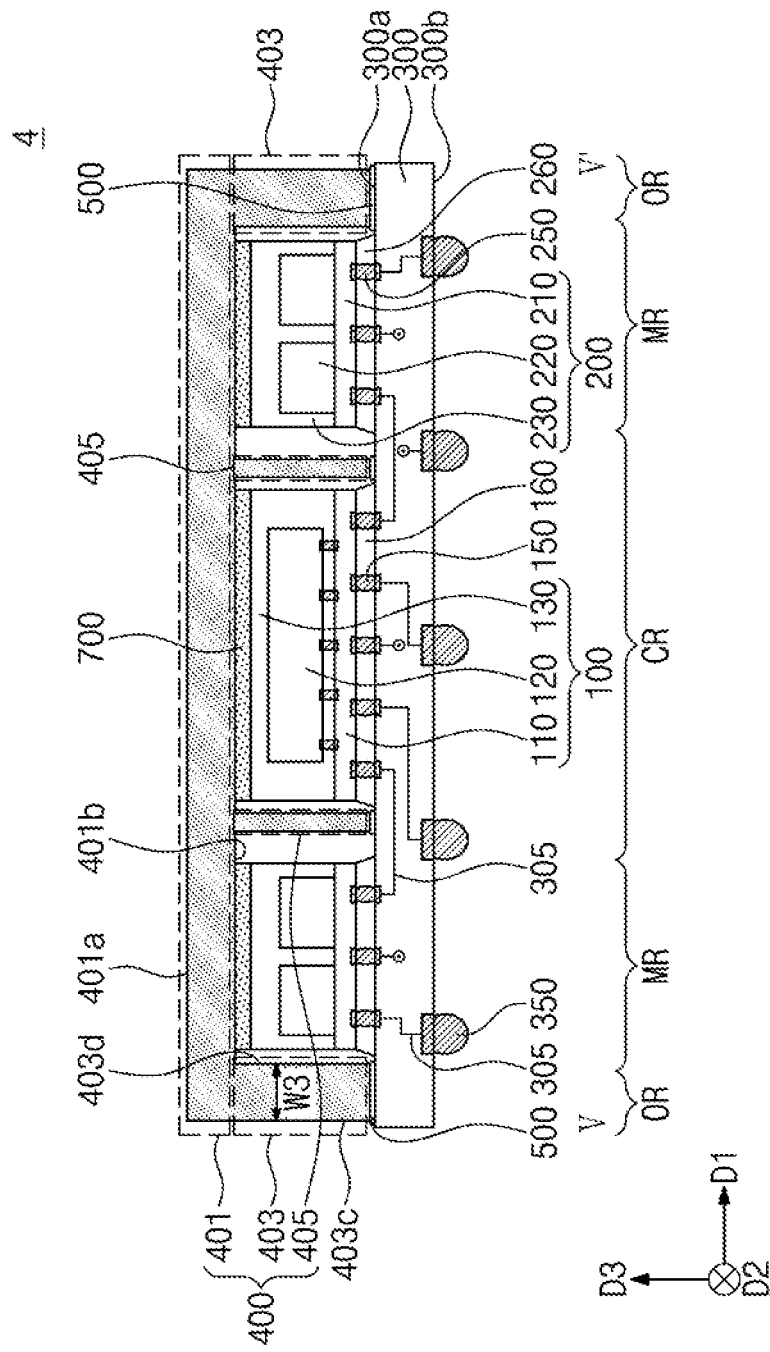
FIG. 9 illustrates a cross-sectional view taken along line V-V' of FIG. 8 according to an exemplary embodiment of the inventive concept.
Figure 10:
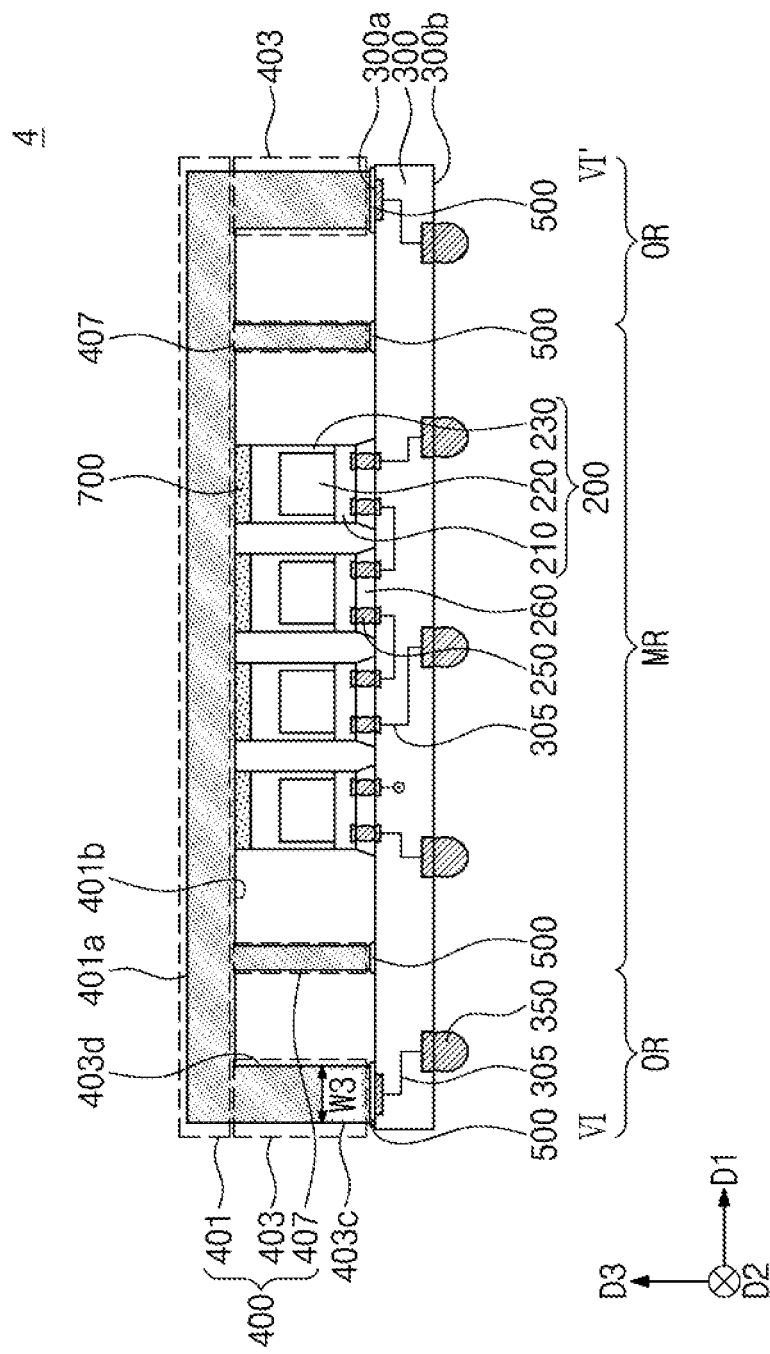
FIG. 10 illustrates a cross-sectional view taken along line VI-VI' of FIG. 8 according to an exemplary embodiment of the inventive concept.

FIG. 8 illustrates a plan view showing a semiconductor module according to an exemplary embodiment of the inventive concept. FIG. 9 illustrates a cross-sectional view taken along line V-V' of FIG. 8. FIG. 10 illustrates a cross-sectional view taken along line VI-VI' of FIG. 8. A duplicate description of substantially same components or parts will be omitted below.

Referring to FIGS. 8 to 10, a semiconductor module 4 may include a substrate 300, a first semiconductor package 100, a second semiconductor package 200, a heat radiation structure 400, an adhesive layer 500, and a thermal conductive layer 700. The first semiconductor package 100, the second semiconductor package 200, the adhesive layer 500, and the thermal conductive layer 700 may be substantially the same as those discussed with reference to FIGS. 1 to 7.

Referring to FIG. 8, in a plan view, the substrate 300 may have a central region CR, an outer region OR, and a middle region MR disposed between the central region CR and the outer region OR. The central region CR may be a central portion of the substrate 300. The outer region OR may surround the central region CR. The outer region OR may be closer than the central region CR to the lateral surface 300c of the substrate 300. The outer region OR may include a corner zone where two adjacent lateral surfaces 300c meet each other. The outer region OR may include an edge region where the lateral surface 300c meet the top surface 300a of the substrate 300. The middle region MR may be interposed between the central region CR and the outer region OR. The middle region MR may surround the central region CR.

The first semiconductor package 100 may be mounted on the top surface 300a of the substrate 300. For example, in a plan view, the first semiconductor package 100 may be mounted on the central region CR of the substrate 300. The second semiconductor package 200 may be mounted on the top surface 300a of the substrate 300. For example, the second semiconductor package 200 may be mounted on the middle region MR of the substrate 300. The second semiconductor package 200 may be disposed spaced apart from the central region CR and the outer region OR. A plurality of the second semiconductor packages 200 may be provided. The plurality of second semiconductor packages 200 may be disposed symmetrically to each other about the first semiconductor package 100. However, the number and planar arrangement of the second semiconductor packages 200 may be variously changed without being limited to that shown in FIG. 8.

The heat radiation structure 400 may be provided on the first semiconductor package 100 and the second semiconductor packages 200. The heat radiation structure 400 may include a first part 401, a second part 403, a third part 405, and a fourth part 407.

The first part 401 of the heat radiation structure 400 may be substantially the same as that discussed with reference to FIGS. 1 to 7. The first part 401 of the heat radiation structure 400 may overlap the central region CR, the middle region MR, and the outer region OR of the substrate 300. The heat radiation structure 400 may have a first top surface 401a and a first bottom surface 401b that are substantially the same as those discussed above.

The second part 403 of the heat radiation structure 400 may be provided on the outer region OR of the substrate 300. The first and second parts 401 and 403 of the heat radiation structure 400 may be formed into a single unitary body. For example, the second part 403 of the heat radiation structure 400 may include the same material as that of the first part 401 of the heat radiation structure 400, and the first and second parts 401 and 403 may be connected to each other without a boundary therebetween. The first and second parts 401 and 403 of the heat radiation structure 400 may be connected to each other on the outer region OR. In a plan view, the second part 403 of the heat radiation structure 400 may be spaced apart from the first semiconductor package 100 and the second semiconductor packages 200, and may overlap the outer region OR of the substrate 300. The second part 403 of the heat radiation structure 400 may surround the first semiconductor package 100 and the second semiconductor packages 200. The second part 403 of the heat radiation structure 400 may surround the middle region MR.

The second part 403 of the heat radiation structure 400 may have an outer surface 403c and an inner surface 403d that are substantially the same as those discussed above with reference to FIGS. 1 to 7. A regular distance may be provided between the outer and inner surfaces 403c and 403d of the second part 403. The distance between the outer and inner surfaces 403c and 403d may be referred to as a width W3 of the second part 403. For example, the width W3 of the second part 403 may be a distance in the first direction D1 from the outer surface 403c to the inner surface 403d. Therefore, in a plan view, the second part 403 may have a tetragonal ring shape whose width W3 is constant.

The third part 405 of the heat radiation structure 400 may be provided on the central region CR of the substrate 300. In a plan view, the third part 405 of the heat radiation structure 400 may be spaced apart from the first semiconductor package 100 and the second semiconductor packages 200, and may surround the first semiconductor package 100. The third part 405 may be provided between the first semiconductor package 100 and the second semiconductor packages 200. For example, the third part 405 may have a tetragonal ring shape. However, the shape of the third part 405 may be variously changed without being limited to that shown. The third part 405 and the first part 401 may be formed into a single unitary body. For example, the third part 405 of the heat radiation structure 400 may include the same material as that of the first part 401 of the heat radiation structure 400, and the first and third parts 401 and 405 may be connected to each other without a boundary therebetween. The first and third parts 401 and 405 of the heat radiation structure 400 may be connected to each other on the central region CR.

The fourth part 407 of the heat radiation structure 400 may be provided on the middle region MR of the substrate 300. In a plan view, the fourth part 407 of the heat radiation structure 400 may be spaced apart from the first semiconductor package 100 and the second semiconductor packages 200, and may be disposed between the second semiconductor packages 200. The fourth part 407 and the first part 401 may be formed into a single body. For example, the fourth part 407 of the heat radiation structure 400 may include the same material as that of the first part 401 of the heat radiation structure 400, and the first and fourth parts 401 and 407 may be connected to each other without a boundary therebetween. The first and fourth parts 401 and 407 of the heat radiation structure 400 may be connected to each other on the middle region MR.

In a plan view, one end of the fourth part 407 of the heat radiation structure 400 may be connected to the second part 403 of the heat radiation structure 400, and another end of the fourth part 407 of the heat radiation structure 400 may be connected to the third part 405 of the heat radiation structure 400. Therefore, the fourth part 407 of the heat radiation structure 400 may run across the middle region MR and may connect the second part 403 to the third part 405. A plurality of the fourth parts 407 of the heat radiation structure 400 may be provided. The plurality of fourth parts 407 of the heat radiation structure 400 may be disposed symmetrically to each other about the central region CR. The fourth parts 407 of the heat radiation structure 400 may extend between the second semiconductor packages 200. In some exemplary embodiments of the inventive concept, the fourth parts 407 of the heat radiation structure 400 may extend radially from the central region CR, thereby connecting the second part 403 to the third part 405. For example, the fourth parts 407 may correspondingly connect corner zones of the second part 403 to corner zones of the third part 405. The number and planar arrangement of the fourth parts 407 may be variously changed without being limited to that shown in FIG. 8.

FIGS. 11 to 14 illustrate cross-sectional views showing a method of fabricating a semiconductor module according to some exemplary embodiments of the inventive concept. A duplicate description of substantially same components or parts will be omitted below.

Figure 11:
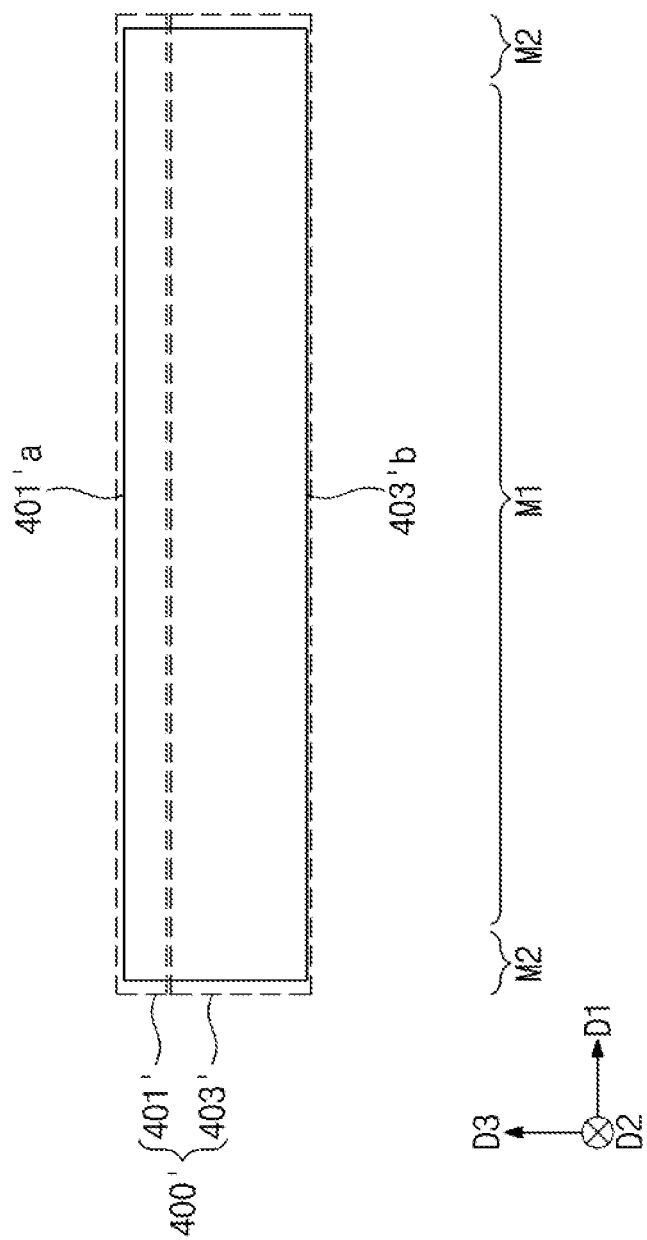
FIGS. 11 to 14 illustrate cross-sectional views showing a method of fabricating a semiconductor module according to some exemplary embodiments of the inventive concept.
Figure 12:
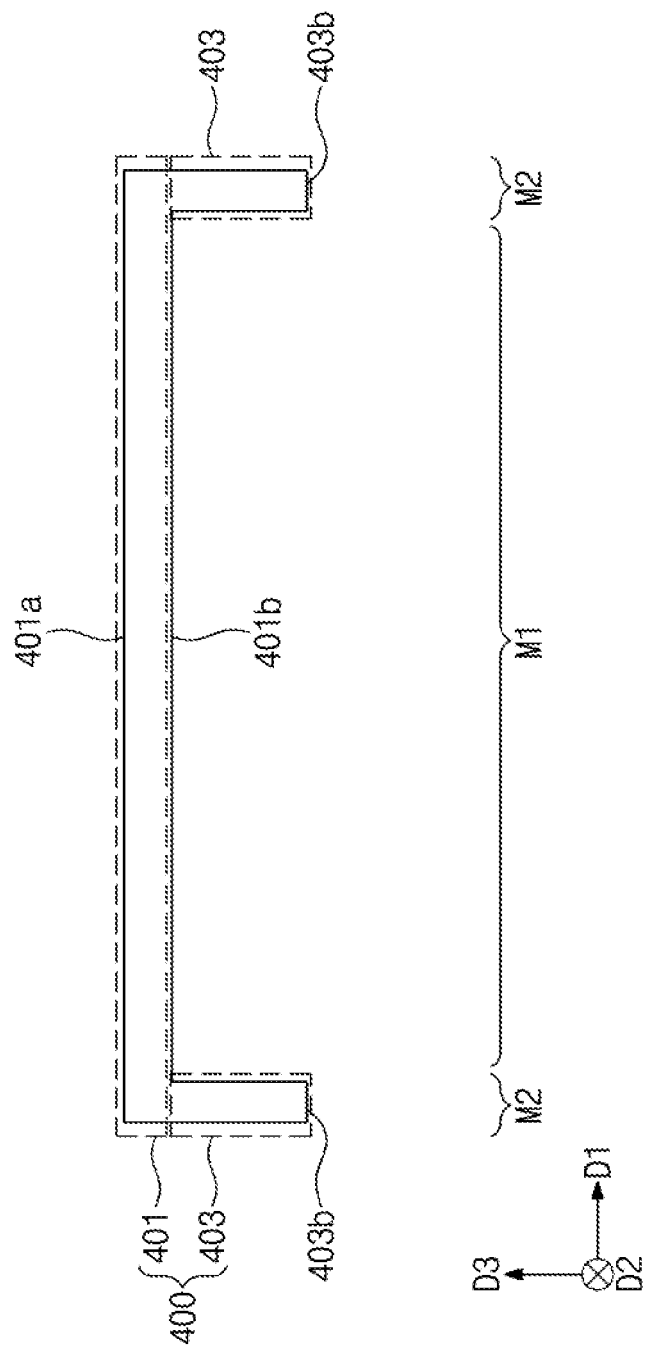

Referring to FIG. 11, a preliminary heat radiation structure 400' may be prepared. For example, a metal plate may be used as the preliminary heat radiation structure 400'. The preliminary heat radiation structure 400' may include a first part 401' and a second part 403'. The preliminary heat radiation structure 400' may have top and bottom surfaces each of which is substantially flat. For example, the first part 401' of the preliminary heat radiation structure 400' may have a flat top surface 401'*a*, and the second part 403' of the preliminary heat radiation structure 400' may have a flat bottom surface 403'*b*. The top surface 401'*a* of the first part 401' may be parallel to the bottom surface 403'*b* of the second part 403'. The preliminary heat radiation structure 400' may have a first region M1 and a second region M2. The first region M1 may be a section on which a first semiconductor package 100 and second semiconductor packages 200 are disposed, and the second region M2 may be a section on which neither first nor second semiconductor packages 100 or 200 are disposed. The second part 403' of the first region M1 may be partially removed to form a heat radiation structure 400 shown in FIG. 12. In some exemplary embodiments of the inventive concept, referring to FIGS. 11 and 12, the bottom surface 403'*b* of the second part 403' of the preliminary heat radiation structure 400' may be at least partially recessed to form the heat radiation structure 400. For example, a mechanical method, such as a milling process, may be performed to recess the bottom surface of the preliminary heat radiation structure 400'. The milling process may be performed on the bottom surface 403'*b* of the second part 403' on the first region M1, but not on the bottom surface 403'*b* of the second part 403' on the second region M2. Therefore, the heat radiation structure 400 may include a first part 401 having a first bottom surface 401*b*, and also include a second part 403 having a bottom surface 403*b* at a different level from that of the first bottom surface 401*b* of the first part 401.

Figure 13:
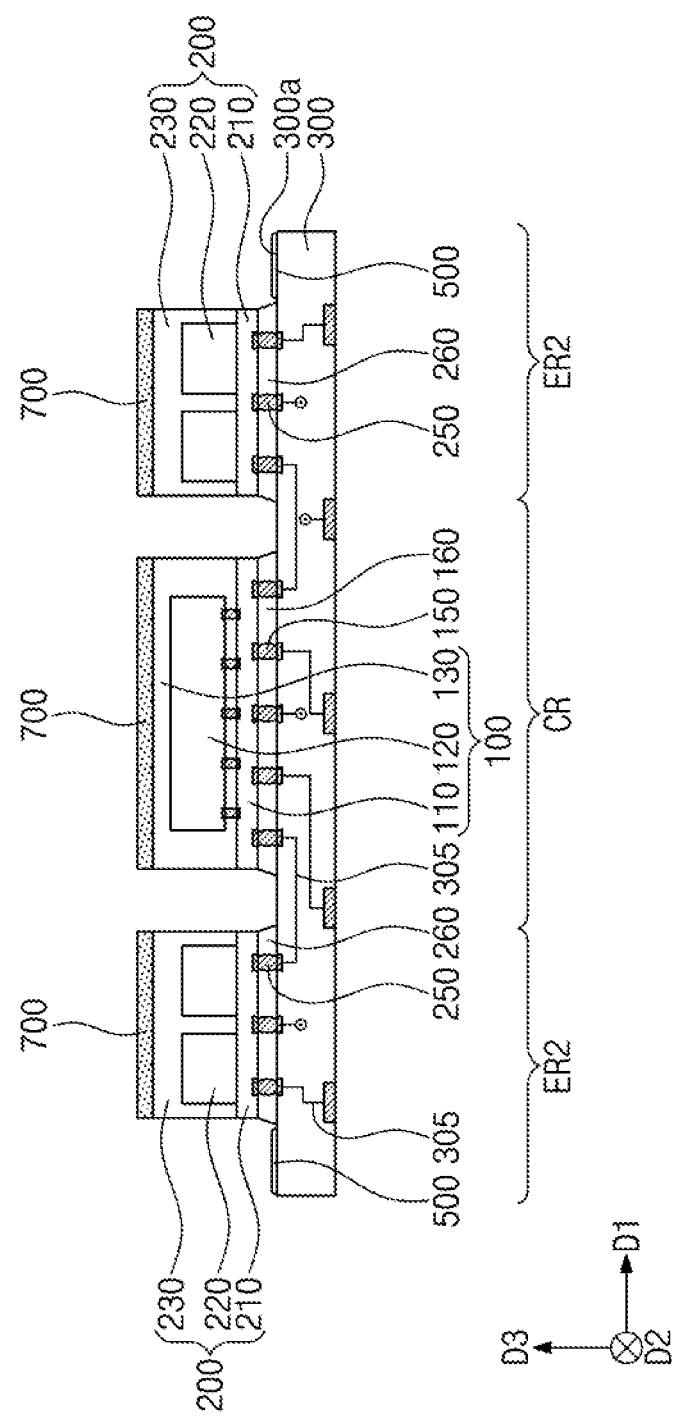

Referring to FIG. 13, a substrate 300 may be prepared on which a first semiconductor package 100 and second semiconductor packages 200 are mounted. An adhesive layer 500 may be formed on a top surface 300*a* of the substrate 300. For example, the adhesive layer 500 may be formed by coating a liquid adhesive material. In another example, the adhesive layer 500 may be formed by attaching an adhesive film on the substrate 300. The adhesive layer 500 may define a zone where the substrate 300 is attached to the bottom surface 403*b* of the second part 403 of the heat radiation structure 400.

Figure 14:
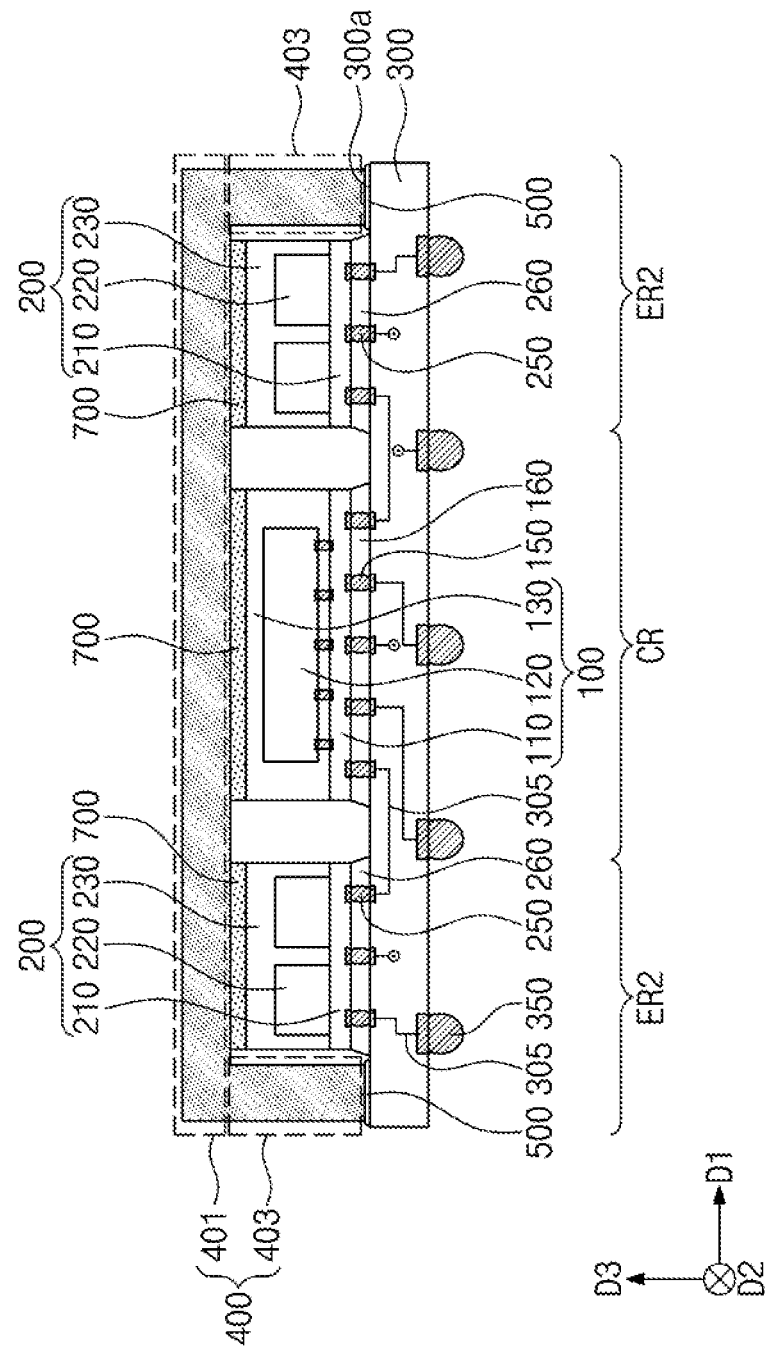

Referring to FIG. 14, the heat radiation structure 400 may be fixed on the top surface 300*a* of the substrate 300. For example, the heat radiation structure 400 may be provided on the substrate 300, such that the second part 403 of the heat radiation structure 400 may face the top surface 300*a* of the substrate 300. The second part 403 may be attached to the adhesive layer 500, and accordingly the heat radiation structure 400 may be fixed on the substrate 300. External terminals 350 may be provided on a bottom surface 300*b* of the substrate 300, and then a reflow process may be performed. Therefore, the external terminals 350 may be fixedly attached to the substrate 300. The processes mentioned above may fabricate any of the semiconductor modules 1, 2, 3, and 4 discussed in FIGS. 1 to 10.

According to an exemplary embodiment of the inventive concept, an increased area may be provided to a contact surface where a heat radiation structure is in contact with a substrate. As a result, the heat radiation structure may be more securely fixed on the substrate, and a semiconductor module may increase in durability.

While the inventive concept has been particularly shown and described with reference to the exemplary embodiments thereof, it will be understood by one of ordinary skill in the art that variations in form and detail may be made therein without departing from the spirit and scope of the inventive concept as defined by the following claims.

What is claimed is:

1. A semiconductor module, comprising:
   a substrate having a central region and an edge region that surrounds the central region, the edge region including;
      a first edge section that includes a corner zone of the substrate, and
      a second edge section disposed between the central region of the substrate and a lateral surface of the substrate,
   wherein the second edge section includes four rectangular regions located on each of the four sides of the central region, respectively, and
   wherein the first edge section does not overlap the central region in a first direction that is parallel to the substrate or in a second direction that is parallel to the substrate and perpendicular to the first direction;

a plurality of semiconductor packages mounted on the substrate, wherein the central region includes only a first semiconductor package of the plurality of semiconductor packages, wherein each of the four rectangular regions includes a plurality of second semiconductor packages that overlap the first semiconductor package in the first direction or the second direction and overlap the first edge section in the first direction or the second direction and wherein the first edge section does not include any semiconductor package; and a heat radiation structure on the semiconductor packages, wherein the heat radiation structure includes:
   a first part on top surfaces of the semiconductor packages; and
   a second part that completely surrounds the semiconductor packages, the second part and the first part being connected as parts of a single unitary body formed of a same material to each other on the edge region of the substrate, wherein the second part of the heat radiation structure includes:
      an outer surface that is externally exposed; and
      an inner surface that is opposite to the outer surface and is adjacent to the semiconductor packages,
      wherein, in a plan view, the outer surface has a tetragonal ring shape along lateral surfaces of the substrate, and
      wherein, in a plan view, the inner surface is crooked along lateral surfaces of the semiconductor packages.

2. The semiconductor module of claim 1, wherein the semiconductor packages include the first semiconductor package and the second semiconductor package different from the first semiconductor package,
   wherein the first semiconductor package is disposed on the central region of the substrate, and
   wherein the second semiconductor package is disposed on the edge region of the substrate.

3. The semiconductor module of claim 2, wherein the second semiconductor package includes a memory chip.

4. The semiconductor module of claim 2, wherein a height of the first semiconductor package is the same as a height of the second semiconductor package.

5. The semiconductor module of claim 1, wherein the inner surface of the second part on the first edge section is not aligned with the inner surface of the second part on the second edge section.

6. The semiconductor module of claim 1, wherein the second part of the heat radiation structure includes:
   an outer surface that is externally exposed; and
   an inner surface that is opposite to the outer surface and is adjacent to the semiconductor packages,
   wherein a distance between the outer and inner surfaces on the first edge section is different from a distance between the outer and inner surfaces on the second edge section.

7. The semiconductor module of claim 1, wherein
portions of the edge region are zones on which the semiconductor packages are mounted, and
other portions of the edge region are spaced apart from the semiconductor packages, the other portions of the edge region are zones on which the semiconductor packages are not mounted and overlap the second part of the heat radiation structure.

8. The semiconductor module of claim 7, wherein the second part of the heat radiation structure at least partially covers the other portions of the edge region.

9. The semiconductor module of claim 1, wherein a ratio of a planar area of a bottom surface of the second part to a planar area on which the semiconductor packages are mounted falls within a range of about 0.78 to about 2.

10. The semiconductor module of claim 1, further comprising an adhesive layer between the substrate and the second part of the heat radiation structure,
   wherein the adhesive layer is in contact with a bottom surface of the second part and with a top surface of the substrate.

11. A semiconductor module, comprising:
   a substrate having a central region, an outer region that surrounds the central region, and a middle region disposed between the central region and the outer region;
   a first semiconductor package mounted on the central region of the substrate;
   a plurality of second semiconductor packages mounted on the middle region of the substrate; and
   a heat radiation structure disposed on the first semiconductor package and the second semiconductor packages,
   wherein the heat radiation structure includes:
      a first part that is disposed on top surfaces of the first and second semiconductor packages;
      a second part that surrounds the middle region, the second part and the first part being connected to each other on the outer region of the substrate;
      a third part that is spaced apart from the second part and surrounds the first semiconductor package, the third part and the first part being connected to each other on the central region of the substrate; and
      a fourth part that extends radially from a corner of the third part and connects the second part to the third part in a plan view,
   wherein the first part, the second part, the third part, and the fourth part are connected as parts of a single unitary body formed of a same material to each other,
   wherein, in a plan view, the fourth part is disposed between the second semiconductor packages, and
   wherein the fourth part extends down in a third direction that is perpendicular to the substrate to overlap the second semiconductor packages in the third direction.

12. The semiconductor module of claim 11, wherein
one end of the fourth part is connected to the second part, another end of the fourth part is connected to the third part, and
the fourth part runs across the middle region.

13. The semiconductor module of claim 11, wherein the fourth part is on the middle region of the substrate.

14. The semiconductor module of claim 11, wherein
the first semiconductor package is different from the second semiconductor packages, and
the first semiconductor package includes a logic chip, a system-on-chip (SOC), or an application processor (AP).

15. The semiconductor module of claim 11, further comprising a thermal conductive layer between the first semiconductor package and the heat radiation structure and between the second semiconductor packages and the heat radiation structure,
   wherein the thermal conductive layer is in contact with the first part.

16. The semiconductor module of claim 11, wherein a ratio of a planar area of a bottom surface of the second part to a planar area on which the first and second semiconductor packages are mounted falls within a range of about 0.78 to about 2.

* * * * *